(12) United States Patent
Covington et al.

(10) Patent No.: US 8,467,154 B2
(45) Date of Patent: Jun. 18, 2013

(54) MAGNETIC SENSORS HAVING PERPENDICULAR ANISOTROPY FREE LAYER

(75) Inventors: Mark William Covington, Edina, MN (US); Dimitar Velikov Dimitrov, Edina, MN (US); Wonjoon Jung, Eden Prairie, MN (US); Dion Song, Eden Pairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 29 days.

(21) Appl. No.: 13/222,113

(22) Filed: Aug. 31, 2011

(65) Prior Publication Data

US 2013/0050876 A1    Feb. 28, 2013

(51) Int. Cl.
*G11B 5/127*    (2006.01)
(52) U.S. Cl.
USPC ...................................................... 360/324.1
(58) Field of Classification Search
USPC ................ 360/324.1, 324.11, 324.2, 324.12, 360/234, 234.6
See application file for complete search history.

(56) References Cited

U.S. PATENT DOCUMENTS

| | | | |
|---|---|---|---|
| 6,707,298 B2* | 3/2004 | Suzuki et al. | 324/252 |
| 7,035,062 B1 | 4/2006 | Mao | |
| 7,151,654 B1 | 12/2006 | Mao | |
| 7,444,872 B2* | 11/2008 | Shoji | 73/514.31 |
| 7,929,258 B2* | 4/2011 | Xue et al. | 360/324.12 |
| 2003/0094944 A1* | 5/2003 | Suzuki et al. | 324/252 |
| 2003/0123198 A1* | 7/2003 | Sugawara et al. | 360/314 |
| 2006/0153976 A1* | 7/2006 | Ito et al. | 427/127 |
| 2007/0186654 A1* | 8/2007 | Shoji | 73/514.16 |
| 2007/0188938 A1* | 8/2007 | Gill | 360/324.2 |
| 2008/0182015 A1* | 7/2008 | Parkin | 427/131 |
| 2009/0185315 A1 | 7/2009 | Xue | |
| 2011/0006384 A1* | 1/2011 | Peng et al. | 257/421 |
| 2011/0007429 A1* | 1/2011 | Dimitrov et al. | 360/319 |
| 2011/0007431 A1* | 1/2011 | Braganca et al. | 360/324.12 |

* cited by examiner

*Primary Examiner* — Allen T Cao
(74) *Attorney, Agent, or Firm* — Mueting Raasch & Gebhardt, P.A.

(57) ABSTRACT

Disclosed herein are magnetic sensors that include: a sensor stack having a front and an opposing back, wherein the front of the sensor stack defines an air bearing surface of the magnetic sensor, and the sensor stack includes: a free layer assembly having a second magnetization direction, that is substantially perpendicular to a plane of each layer of the sensor stack; and a stabilizing structure positioned away from the air bearing surface at the back of the sensor stack.

26 Claims, 7 Drawing Sheets

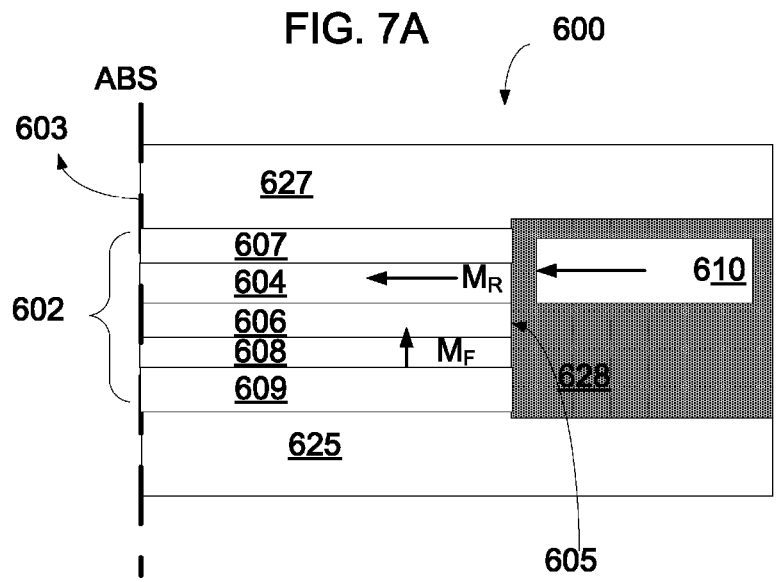
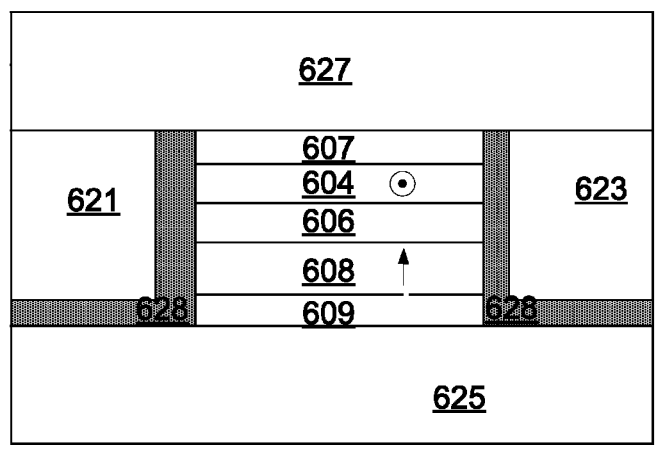

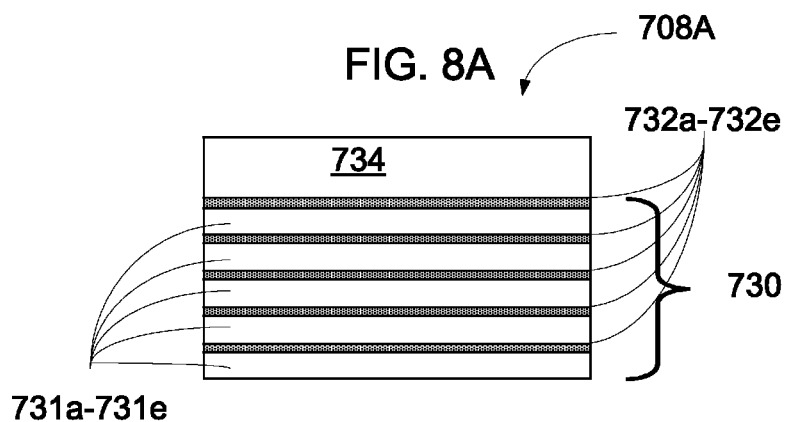
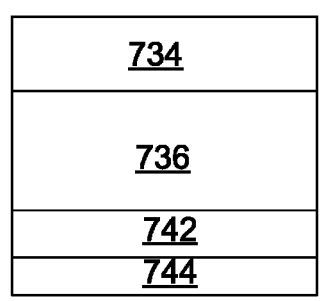
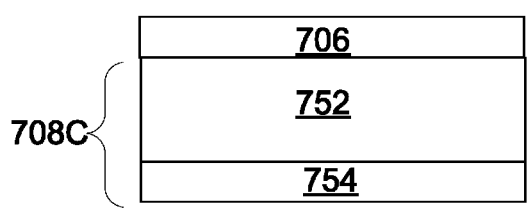

MAGNETIC SENSORS HAVING PERPENDICULAR ANISOTROPY FREE LAYER

FIELD

This disclosure relates generally to magnetic sensors that include a free layer having perpendicular anisotropy.

BACKGROUND

In an electronic data storage and retrieval system, a magnetic recording head typically includes a reader portion having a sensor for retrieving magnetically encoded information stored on a magnetic medium. Magnetic flux from the surface of the medium causes rotation of the magnetization vector of a sensing layer or layers of the sensor, which in turn causes a change in the electrical properties of the sensor. The sensing layers are often called free layers, since the magnetization vectors of the sensing layers are free to rotate in response to external magnetic flux. The change in the electrical properties of the sensor may be detected by passing a current through the sensor and measuring a voltage across the sensor. Depending on the geometry of the device, the sense current may be passed in the plane (CIP) of the layers of the device or perpendicular to the plane (CPP) of the layers of the device. External circuitry then converts the voltage information into an appropriate format and manipulates that information as necessary to recover information encoded on the disc.

A structure in contemporary read heads is a thin film multilayer structure containing ferromagnetic material that exhibits some type of magnetoresistance. A typical magnetoresistive sensor configuration includes a multilayered structure formed of a nonmagnetic layer (such as a thin insulating barrier layer or a nonmagnetic metal) positioned between a synthetic antiferromagnet (SAF) and a ferromagnetic free layer, or between two ferromagnetic free layers. The resistance of the magnetic sensor depends on the relative orientations of the magnetization of the magnetic layers.

With increased recording densities, the dimensions of the magnetic sensor are decreased to sense the magnetic flux of each bit on the magnetic medium. A consequence of decreasing the size of the magnetic sensor is preserving the magnetization of the in-plane anisotropy of the magnetic layers of the magnetic sensor. For example, at smaller dimensions, the magnetization of a portion of the free layer may cant away from the anisotropic magnetization direction to minimize magnetostatic energy. The relative fraction of the region with canted magnetization may increase as the dimensions continue to decrease. In addition, changes in the canting direction caused by thermal variations or external fields may increase noise and instability in the sensor. Furthermore, when a permanent magnet is employed to bias magnetic layers in the magnetic sensor, the magnetization direction of the reference layer may be tilted off-axis, thereby reducing the signal generated by the magnetic sensor.

SUMMARY

Disclosed herein are magnetic sensors that include: a sensor stack having a front and an opposing back, wherein the front of the sensor stack defines an air bearing surface of the magnetic sensor, and the sensor stack includes: a free layer assembly having a second magnetization direction, that is substantially perpendicular to a plane of each layer of the sensor stack; and a stabilizing structure positioned away from the air bearing surface at the back of the sensor stack.

Also disclosed are sensors that include a sensor stack having a front and an opposing back, wherein the front of the sensor stack defines an air bearing surface of the magnetic sensor, and the sensor stack includes: a reference layer assembly having a first magnetization direction, the reference layer assembly comprising at least one ferromagnetic layer; a free layer assembly having an effective magnetization direction substantially perpendicular to the first magnetization direction and substantially perpendicular to a plane of each layer of the sensor stack, the free layer assembly including at least one layer of CoFeB; and a stabilizing structure positioned away from the air bearing surface at the back of the sensor stack.

Also disclosed are magnetic sensors that include a sensor stack having a front and an opposing back, wherein the front of the sensor stack defines an air bearing surface of the magnetic sensor, and the sensor stack includes: a free layer assembly having a second magnetization direction that is substantially perpendicular to a plane of each layer of the sensor stack, the free layer assembly including a layer of CoFeB a layer of Ta; a spacer layer positioned adjacent the free layer assembly, wherein the CoFeB layer of the free layer assembly is adjacent the spacer layer; and a permanent magnet positioned away from the air bearing surface at the back of the sensor stack, the permanent magnet having a magnetization direction that is substantially perpendicular to the second magnetization direction.

BRIEF DESCRIPTION OF THE DRAWINGS

FIG. 4C shows readback amplitudes and asymmetries as a function of Hk.

FIGS. 7A and 7B depict a cross-sectional view (FIG. 7A) and an ABS view (FIG. 7B) of an exemplary magnetic sensor that includes a stabilizing structure including a permanent magnet and other optional features; and FIGS. 8A, 8B, and 8C depict layer diagrams of exemplary free layer assemblies that include a multilayer structure (FIG. 8A), a seed layer (FIG. 8B), and a bottom layer (FIG. 8C).

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

"Include," "including," or like terms means encompassing but not limited to, that is, including and not exclusive. It should be noted that "top" and "bottom" (or other terms like "upper" and "lower") are utilized strictly for relative descriptions and do not imply any overall orientation of the article in which the described element is located.

Figure 1:
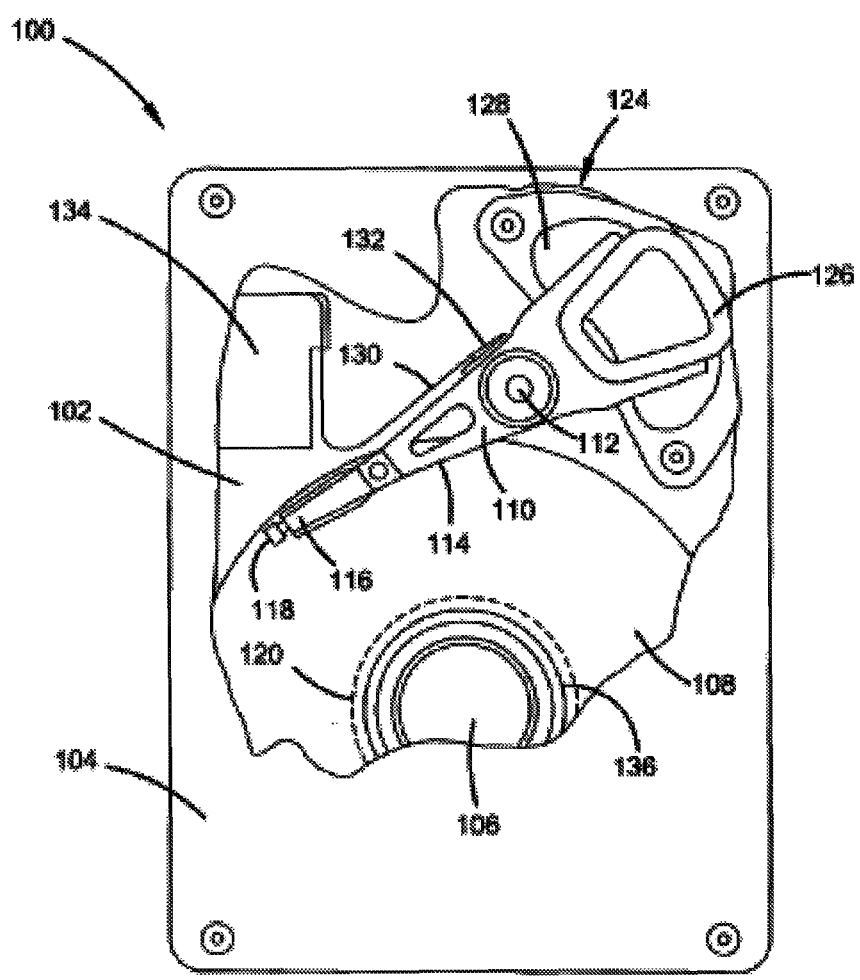
FIG. 1 is a plan view of a disc drive incorporating a preferred embodiment of the present invention showing the primary internal components.

A disc drive 100 in accordance with an embodiment is shown in FIG. 1. The disc drive 100 includes a base 102 to which various components of the disc drive 100 are mounted. A top cover 104, shown partially cut away, cooperates with the base 102 to form an internal, sealed environment for the disc drive. The components include a spindle motor 106 which rotates one or more discs 108 at a constant high speed. Information is written to and read from tracks on the discs 108 through the use of an actuator assembly 110, which rotates during a seek operation about a bearing shaft assembly 112 positioned adjacent the discs 108. The actuator assembly 110 includes a plurality of actuator arms 114 which extend towards the discs 108, with one or more flexures 116 extending from each of the actuator arms 114. Mounted at the distal end of each of the flexures 116 is a head 118 which includes an air bearing slider enabling the head 118 to fly in close proximity above the corresponding surface of the associated disc 108.

During a seek operation, the track position of the heads 118 is controlled through the use of a voice coil motor (VCM) 124, which typically includes a coil 126 attached to the actuator assembly 110, as well as one or more permanent magnets 128 which establish a magnetic field in which the coil 126 is immersed. The controlled application of current to the coil 126 causes magnetic interaction between the permanent magnets 128 and the coil 126 so that the coil 126 moves in accordance with the well known Lorentz relationship. As the coil 126 moves, the actuator assembly 110 pivots about the bearing shaft assembly 112, and the heads 118 are caused to move across the surfaces of the discs 108 to read from or write to tracks 136 on the disc.

The spindle motor 106 is typically de-energized when the disc drive 100 is not in use for extended periods of time. The heads 118 are moved over park zones 120 near the inner diameter of the discs 108 when the drive motor is de-energized. The heads 118 are secured over the park zones 120 through the use of an actuator latch arrangement, which prevents inadvertent rotation of the actuator assembly 110 when the heads are parked.

A flex assembly 130 provides the requisite electrical connection paths for the actuator assembly 110 while allowing pivotal movement of the actuator assembly 110 during operation. The flex assembly includes a printed circuit board 132 to which head wires (not shown) are connected; the head wires being routed along the actuator arms 114 and the flexures 116 to the heads 118. The printed circuit board 132 typically includes circuitry for controlling the write currents applied to the heads 118 during a write operation and a preamplifier for amplifying read signals generated by the heads 118 during a read operation. The flex assembly terminates at a flex bracket 134 for communication through the base deck 102 to a disc drive printed circuit board (not shown) mounted to the bottom side of the disc drive 100.

A head, as seen within the context of FIG. 1 can include a writer and a reader, which can also be referred to as a magnetic sensor. Magnetic sensors as disclosed herein can be included in disc drives, such as those discussed with respect to FIG. 1.

Figure 2:
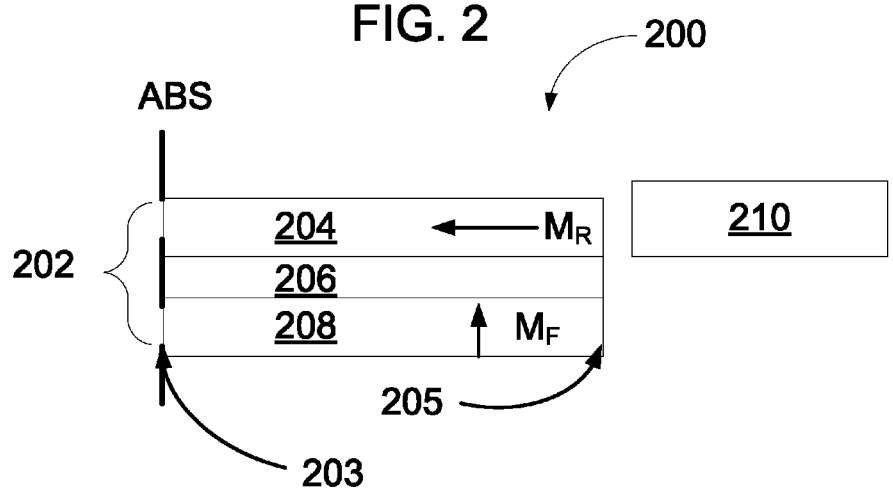
FIG. 2 depicts a cross-sectional view of an exemplary magnetic sensor.

FIG. 2 depicts an exemplary magnetic sensor 200. The magnetic sensor generally includes a sensor stack 202 and a stabilizing structure 210. The sensor stack 202 produces different resistances depending on surrounding magnetic fields. When such a sensor stack is configured within a disk drive, such as that described above, the sensor stack produces resistances depending on the data bits contained in tracks on the data discs. The different resistances can then be utilized to read the information in the data bits on the data discs. The stabilizing structure 210 functions to provide magnetic stability to a portion of the sensor stack 202. In embodiments, the stabilizing structure 210 functions to provide magnetic stability to the reference layer assembly, which will be discussed below, of the sensor stack 202. In such embodiments, the stabilizing structure 210 can also be referred to as a reference layer stabilizing structure. In embodiments, the stabilizing structure 210 can provide magnetic stability to only the reference layer assembly of the sensor stack 202. The stabilizing structure 210 can be physically adjacent to (or in contact with) at least some portion of the sensor stack 202, or can be physically removed from (or not in contact with) any portion of the sensor stack 202.

The sensor stack 202 depicted in FIG. 2 has a front 203 or a front surface and an opposing back 205 or a back surface. The front of the sensor stack 202 also defines the air bearing surface (ABS) of the magnetic sensor. When such a sensor stack is configured within a head of a disc drive, the air bearing surface is the surface that flies above the surface of the data disc. The stabilizing structure 210 is generally positioned away from the ABS. In embodiments, the stabilizing structure 210 can be described as positioned at the back of the sensor stack 202. The stabilizing structure 210 can also be described as being positioned behind the stripe of the sensor. The stabilizing structure 210 can also be characterized as being positioned such that it does not add to the thickness of the magnetic sensor. The thickness of the magnetic sensor can be described as the height of the various layers of the magnetic sensor at and along the ABS.

An exemplary sensor stack 202 can include a reference layer assembly 204, a spacer layer 206, and a free layer assembly 208. The spacer layer 206 is generally positioned between the reference layer assembly 204 and the free layer assembly 208. Although the sensor stack 202 is positioned with the reference layer assembly 204 on top and the free layer assembly 208 positioned on the bottom, it should be understood that the configuration can be flipped so that the free layer assembly 208 is on top and the reference layer assembly 204 is on the bottom. In such a configuration, the stabilizing structure 210 would be moved down so that it is magnetically coupled to the reference layer assembly 204. It should be noted that other layers can also be included in sensor stack 202, including for example seed and cap layers.

Reference layer assembly 204 has a fixed magnetization direction $M_R$. The magnetization direction of the reference layer assembly 204 can be referred to as a first magnetization direction. The first magnetization direction can be substantially in-plane with the layer or layers of reference layer assembly 204, and/or the layers of the sensor stack 202. In embodiments, reference layer assembly 204 may be a single ferromagnetic layer having an anisotropically defined magnetization direction. Reference layer assembly 204 may also include various combinations of layers to provide magnetization $M_R$ having a fixed direction, such as a ferromagnetic pinned layer with an antiferromagnetic pinning layer, a synthetic ferromagnetic pinned layer (i.e., two ferromagnetic layers coupled by a nonmagnetic metal, such as Ru), or a synthetic ferromagnetic pinned layer coupled to an antiferromagnetic pinning layer. Ferromagnetic layers of reference layer assembly 204 may also be made of a ferromagnetic alloy, such as CoFe, NiFe, or NiFeCo, and the antiferromagnetic layer may be made of PtMn, IrMn, NiMn, or FeMn.

Spacer layer 206 is generally disposed or positioned between free layer assembly 208 and the reference layer assembly 204. Spacer layer 206 is generally a nonmagnetic material. In some embodiments, spacer layer 206 can be a nonmagnetic, conductive material, such as for example Cu, Ag, Au, Ru, or alloys thereof. In some embodiments, spacer layer 206 can be a nonmagnetic Heusler alloy material (such embodiments can optionally be combined with the use of Heusler alloy ferromagnetic layers as the free layer assembly 208 and/or the reference layer assembly 204). In embodiments where the spacer layer 206 is a nonmagnetic conductive material, the magnetic sensor 202 can be considered a giant magnetoresistive sensor. In other embodiments, spacer layer 206 can be a non-magnetic, insulative or semi-conductive material, such as oxides formed of Mg, Al, Hf, or Ti, rendering magnetic sensor 202 a tunneling magnetoresistive sensor.

Free layer assembly 208 has a non-fixed or free magnetization direction, $M_F$. The magnetization direction of the free layer assembly 208 can be referred to as a second magnetization direction. The second magnetization direction can be substantially perpendicular to the first magnetization direction $M_R$ in a quiescent state, and/or substantially perpendicular to a plane of each layer of the sensor stack 202.

Free layer assembly 208 can be a single or a multiple layer structure having an overall magnetization $M_F$ that rotates in response to an external magnetic field, such as localized magnetic fields from a magnetic medium or data disc. Second magnetization $M_F$ is a function of the magnetizations of all layers of the free layer assembly 208. Free layer assembly 208 has an effective or net direction that is perpendicular to the plane of each layer of free layer assembly 208 in a quiescent state (i.e., when no external field is applied to sensor stack 202 or when the net magnetic field exerted on sensor stack 202 is zero). Magnetization $M_F$ of free layer assembly 208 in a quiescent state is due to the perpendicular anisotropy of a layer or layers of the free layer assembly 208. While the direction of magnetization $M_F$ in a quiescent state is shown directed toward the top of sensor stack 202, the layer or layers of free layer assembly 208 may alternatively have effective magnetization direction that is directed toward the bottom of sensor stack 202 in a quiescent state. When free layer assembly 208 has perpendicular-to-the-plane anisotropy, canting of the magnetization proximate the edges of the layer or layers of free layer assembly 208 is prevented. This can reduce noise in the sensor stack 202, thereby modifying the signal generated, and modify the stability of sensor stack 202. Exemplary materials that can be utilized in the free layer assembly are discussed below with respect to FIGS. 7A to 7C.

Stabilizing structure 210 can include any structure(s) or layer(s) that can function to stabilize the magnetic orientation of the reference layer assembly 204. As discussed above with respect to FIG. 2, the stabilizing structure 210 generally functions to stabilize the magnetization of the reference layer assembly 204. Generally, the stabilizing structure 210 is positioned at the back of the sensor stack 202, or behind the back 205 of the sensor stack 202.

Figure 3:
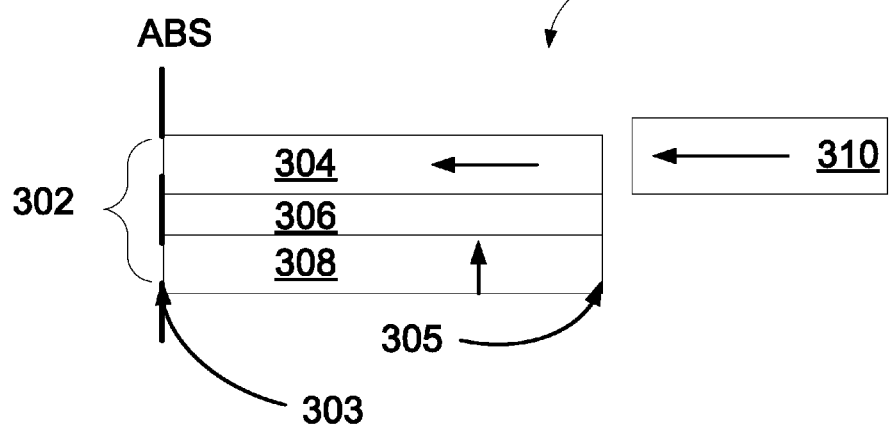
FIG. 3 depicts a cross-sectional view of an exemplary magnetic sensor that includes a stabilizing structure including a permanent magnet.

In embodiments, the stabilizing structure can include a permanent magnet. FIG. 3 depicts an example of a sensor stack that includes a permanent magnet as a stabilizing structure 310. This embodiment of a magnetic sensor 300 includes a sensor stack 302 that includes a reference layer assembly 304 having a first magnetization (depicted by the arrow), a free layer assembly 308 having a second magnetization (depicted by the arrow), and a spacer layer 306 positioned therebetween. The sensor stack 302 has a front 303 that defines the ABS of the magnetic sensor 300 and an opposing back 305. Positioned at the back 305 of the magnetic sensor is the stabilizing structure 310. In embodiments, the stabilizing structure can be positioned at the back of the reference layer assembly 304. In embodiments, the stabilizing structure 310 can be magnetically coupled to the reference layer assembly 304.

In this exemplary embodiment the stabilizing structure 310 includes a permanent magnet. In embodiments, the stabilizing structure 310 can include only a permanent magnet, or can also optionally include seed layer(s), cap layer(s), or some combination thereof. The permanent magnet of the stabilizing structure 310 can have a fixed magnetization direction. In embodiments, the magnetization direction of the permanent magnet (depicted by the arrow within the stabilizing structure 310) can be substantially parallel to the magnetization direction of the reference layer assembly 304, which is the first magnetization direction. In such embodiments, the magnetization of the permanent magnet can function to provide magnetic stability to the reference assembly 304, which can allow the reference layer assembly 304 to be thinner and still be magnetically stable. This can allow the overall thickness of the magnetic sensor to be decreased, which can ultimately afford higher areal density reading.

In embodiments where the stabilizing structure 310 is a permanent magnet, the reference layer assembly 304 can include only a single layer of ferromagnetic material. Exemplary ferromagnetic materials that can be utilized for a single layer reference layer assembly 304 can include ferromagnetic alloys, such as alloys that include cobalt (Co), iron, (Fe), nickel (Ni), or combinations thereof. Specific examples of such alloys include for example CoFe, CoFeB, NiFe, and NiFeCo.

In embodiments where the stabilizing structure 310 includes a permanent magnet, the permanent magnet can include various magnetic materials, including for example platinum alloys, and cobalt alloys; such as CoPt, CoCrPt, and FePt. The material of the permanent magnet can have magnetic strengths from about 500 emu/cc to about 1500 emu/cc, in embodiments from about 750 emu/cc to about 1250 emu/cc, and in embodiments from about 1000 emu/cc to about 1200 emu/cc. Generally, the permanent magnet can have thicknesses (measured parallel to the ABS) ranging from about 3 nanometers (nm) to about 20 nm, in embodiments from about 3 nm to about 15 nm, and in embodiments from about 5 nm to about 10 nm. In embodiments, the permanent magnet can extend a few, or perhaps tens of micrometers (μm) in the lateral directions.

Stabilizing structures that include permanent magnets, such as that one depicted in FIG. 3 can be separated from the back of the reference layer assembly 304 by an insulating material. In embodiments, the insulating material is also non-magnetic. Insulating materials, including for example $Al_2O_3$ (alumina), $ZrO_2$ (zirconia), $SiO_2$ (silica or silicon dioxide), $Si_3N_4$ (silicon nitride) and $TiO_2$ (titania). The distance between the stabilizing structure and the reference layer assembly can vary. In embodiments, the stabilizing structure can be separated from the reference layer assembly by from about 2 nm to about 10 nm.

Figure 4A:
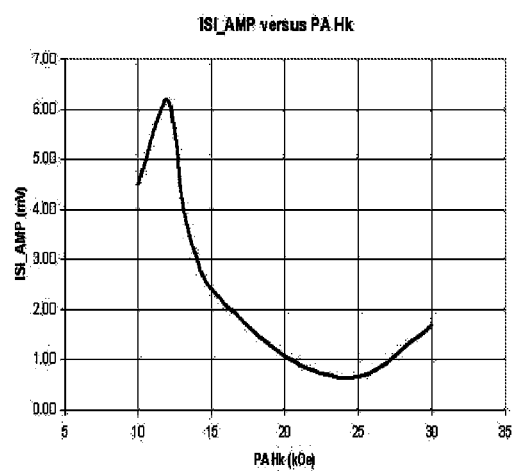
FIGS. 4A-4C show the readback amplitude (FIG. 4A) and asymmetry (FIG. 4B) in the external magnetic field excitation as a function of the magnitude of the free layer perpendicular anisotropy (Hk) of an embodiment.
Figure 4B:
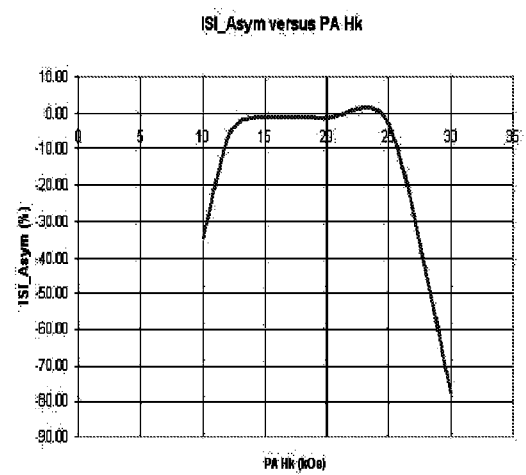
Figure 4C:
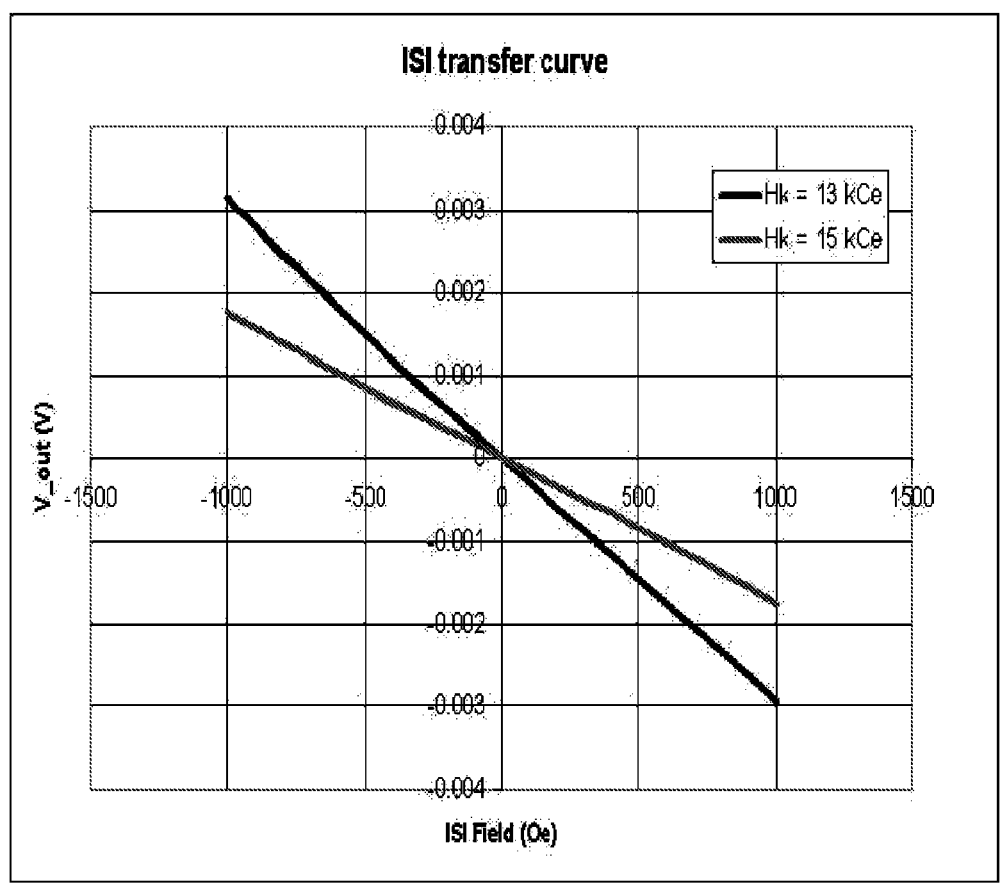

Micromagnetic modeling has been performed to evaluate the expected amplitude and asymmetry in an embodiment such as that proposed in FIG. 3. FIGS. 4A and 4B show the readback amplitude (FIG. 4A) and asymmetry (FIG. 4B) in the external magnetic field excitation as a function of the magnitude of the free layer perpendicular anisotropy (Hk). For small Hk the magnetization in the free layer is essentially in the plane of the film which results in a somewhat undesirable amplitude and asymmetry. When Hk is larger than a threshold value (in the case that was modeled ~12.5 kOe) the free layer magnetization becomes essentially out of plane. FIG. 4A illustrates that the asymmetry is excellent over a very large range of Hk (when Hk is larger than the threshold value) but there is a steady decrease in the amplitude as Hk increases. Thus a very desirable implementation is to have Hk slightly above the threshold value of 12.5 kOe. FIG. 4C demonstrates that in such a case excellent linear transfer curves can be achieved, with large readback amplitudes and asymmetry close to zero. When Hk is substantially increased (Hk>25 kOe) the asymmetry deteriorates fairly substantially. Micromagnetic modeling showed that the cause for this deterioration is the formation of a stripe domain in the sensor. For such large Hk the domain wall width of the stripe domain is small and can be accommodated within the stripe height (SH) of the sensor. In embodiments, where Hk is too small, it can be insufficient to bring the free layer perpendicular to the plane, while Hk being too large leads to formation of stripe domains. In embodiments, Hk can be between about 12 kOe and 20 kOe.

Figure 5:
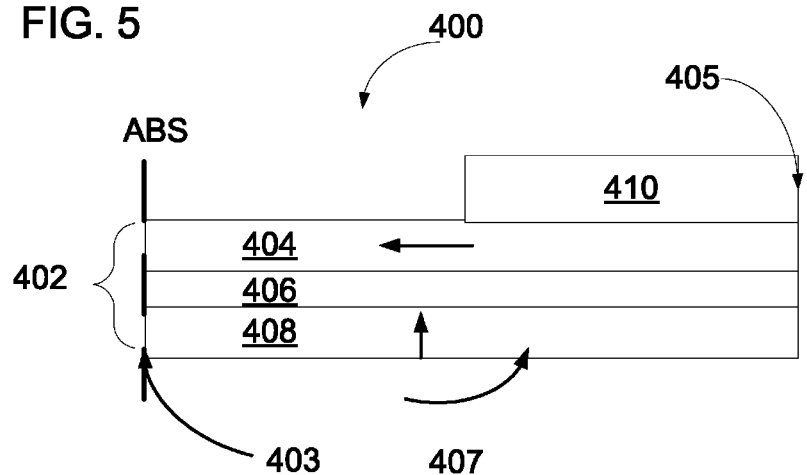
FIG. 5. depicts a cross-sectional view of an exemplary magnetic sensor that includes a stabilizing structure including an antiferromagnetic portion.

FIG. 5 depicts another exemplary embodiment of a magnetic sensor disclosed herein. The magnetic sensor 400 depicted in FIG. 5 includes components similar to those depicted in connection with FIG. 2. An exemplary magnetic sensor 400 includes a sensor stack 402 that includes a reference layer assembly 404 having a first magnetization (depicted by the arrow), a free layer assembly 408 having a second magnetization (depicted by the arrow), and a spacer layer 406 positioned therebetween. The sensor stack 402 has a front surface 403 that defines the ABS of the magnetic sensor 400 and an opposing back surface 405. The sensor stack 402 also has a back region 407. It should be noted that the back region 407 of the sensor stack 402 is not the back surface 405.

Positioned at the back region 407 of the magnetic sensor is the stabilizing structure 410. In the embodiment depicted in FIG. 5, the stabilizing structure 410 can include an antiferromagnetic material. In embodiments, the stabilizing structure 410 can be positioned adjacent the back region 407 of the reference layer assembly 404. In embodiments, the stabilizing structure 410 can be magnetically coupled or more specifically exchange coupled to the reference layer assembly 404. The stabilizing structure 410 in this embodiment is proximate to or more specifically in contact with the reference layer assembly 404. In such an embodiment, the reference layer assembly 404, the spacer layer 406 and the free layer assembly 408 can extend further away from the ABS than the corresponding layers in embodiments where the stabilizing structure 410 is not in contact with the reference layer assembly 404. This can also be described as the sensor stack having a longer height (away from the ABS) or a longer stripe height.

The antiferromagnetic material of this exemplary stabilizing structure can be surrounded, on the surfaces where it is not in contact with the reference layer assembly, with insulating material. Exemplary insulating materials, including $Al_2O_3$ (alumina), $ZrO_2$ (zirconia), $SiO_2$ (silica or silicon dioxide), $Si_3N_4$ (silicon nitride) and $TiO_2$ (titania) can be utilized to insulate the antiferromagneitc material of the stabilizing structure.

In this exemplary embodiment the stabilizing structure 410 can include an antiferromagnetic material portion. Antiferromagnetic materials, including for example FeMn, PtMn, IrMn, or NiMn. Generally, the antiferromagnetic portion of the stabilizing structure can have thicknesses ranging from about 3 nm to about 12 nm.

Figure 6:
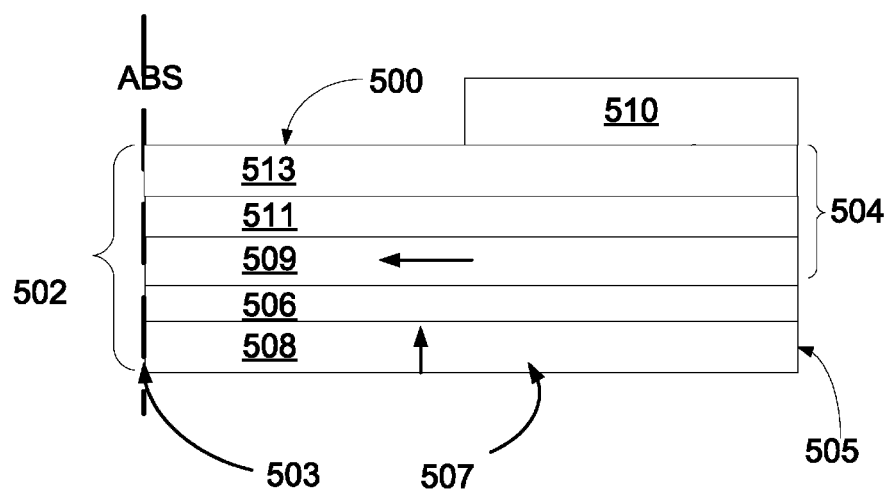
FIG. 6. depicts a cross-sectional view of another exemplary magnetic sensor that includes a stabilizing structure including an antiferromagnetic portion.

FIG. 6 depicts another exemplary embodiment of a magnetic sensor disclosed herein. The magnetic sensor 500 depicted in FIG. 6 includes components similar to those depicted in connection with FIG. 5. An exemplary magnetic sensor 500 includes a sensor stack 502 that includes a reference layer assembly 504. The reference layer assembly 504 includes a reference layer 509 and a pining layer 513 that are separated by a separation layer 511. In such a reference layer assembly 504 the reference layer 509 is exchanged coupled to the pinning layer 513 through the separation layer 511. The reference layer 509 can generally be made of materials such as those discussed above with respect to the single layer reference layer assembly (CoFe, CoFeB, NiFe, or NiFeCo for example). The separation layer 511 can generally be made of a nonmagnetic metallic materials, including for example ruthenium (Ru), rhodium (Rh), iridium (Ir), and chromium (Cr). The pinning layer 513 can generally be made of antiferromagnetic materials such as PtMn, IrMn, NiMn, or FeMn for example. The reference layer assembly 504 has an overall magnetization that can be substantially in-plane with the layer or layers of reference layer assembly 504.

The magnetic sensor 500 of this embodiment also includes a free layer assembly 508 having a second magnetization (depicted by the arrow), and a spacer layer 506 positioned between the free layer assembly 508 and the reference layer assembly 504. The sensor stack 502 has a front surface 503 that defines the ABS of the magnetic sensor 500 and an opposing back surface 505. The sensor stack 502 also has a back region 507.

Positioned at the back region 507 of the magnetic sensor 500 is a stabilizing structure 510. In the embodiment depicted in FIG. 6, the stabilizing structure can include an antiferromagnetic material. In embodiments, the stabilizing structure 510 can be positioned adjacent the back region 507 of the reference layer assembly 504. In embodiments, the stabilizing structure 510 can be magnetically coupled or more specifically exchange coupled to the reference layer assembly 504. The stabilizing structure 510 in this embodiment is proximate to or more specifically in contact with the reference layer assembly 504. In such an embodiment, the reference layer assembly 504, the spacer layer 506 and the free layer assembly 508 can extend further away from the ABS than the corresponding layers in embodiments where the stabilizing structure is not in contact with the reference layer assembly. This can also be described as the sensor stack having a longer height (away from the ABS) or a longer stripe height. In the embodiment depicted in FIG. 6, the stabilizing structure 510 is proximate to or more specifically in direct contact with the pinning layer 513 of the multilayer reference layer assembly 504. The antiferromagnetic stabilizing structure 510 is thereby exchange coupled to the reference layer assembly 504 through the pinning layer 513 of the reference layer assembly 504.

Magnetic sensors described herein can also contain other structures. The embodiment depicted in FIGS. 7A and 7B depict an example of a magnetic sensor having additional optional components. The exemplary magnetic sensor 600 includes a sensor stack 602 that can have a reference layer assembly 604, a free layer assembly 608, and a spacer layer 606 positioned therebeween. The sensor stack 602 has a front surface 603 that defines the ABS, and an opposing back surface 605. The magnetic sensor 600 includes a stabilizing structure 610, which in this embodiment is a permanent magnet. This exemplary magnetic sensor also includes a seed layer 609 on the bottom of the sensor stack 602 beneath the free layer assembly 608. Seed layers can be utilized as a processing tool allowing effective deposition of a layer of material, can be used to control properties of a layer (such as crystallographic orientation), or combinations thereof. This exemplary magnetic sensor 600 can also include a cap layer 607 on the top of the sensor stack 602, in this case on eh reference layer assembly 604. The cap layer 607 can function to protect the sensor stack 602 from physical damage, for example. Optional seed and cap layers can also function to magnetically de-couple shields from the magnetic layers in the sensor stack.

The exemplary magnetic sensor 600 can also include or be configured with a bottom shield 625, and a top shield 627. Top and bottom shields 627 and 625 may optionally be connected to first and second electrodes (not depicted herein), respectively, or may act as first and second electrodes for passing and collecting currents through and from the magnetic sensor. The height of the sensor stack 602 provides the shield to shield spacing (SSS) which, because the stabilizing structure 610 is behind the sensor stack 602, can be small. This exemplary magnetic sensor 600 also includes an insulator 628. Insulator 628 can function to inhibit a shunting effect, which can occur if the sensing current being passed through the sensor stack between top and bottom shields is directed into the stabilizing structure (in this case a permanent magnet), which could reduce the signal from the magnetic sensor.

FIG. 7B shows the magnetic sensor 600 looking up from the ABS. This view also shows the side shields 621 and 623, which are similarly insulated from the sensor stack 602 by the insulator 628. It should be noted that the regions of the insulator 628 can be a continuous structure made of an insulating material, or can be numerous areas of insulting material that are not connected.

As noted above, the free layer assembly can be a single or a multiple layer structure having a magnetization $M_F$ that has an effective or net direction that is perpendicular to the plane of each layer of the free layer assembly and the sensor stack when in a quiescent state. FIGS. 8A, 8B, and 8C depict more specific embodiments of exemplary free layer assemblies that can be utilized within disclosed magnetic sensors.

FIG. 8A is a layer diagram of free layer assembly 708A that is suitable for use in a magnetic sensor. This exemplary free layer assembly 708A includes multilayer structure 730. Multilayer structure 730 includes repeating first magnetic layers 731a-731e and second magnetic layers 732a-732e. It should be noted that while multiple bilayers are shown, free layer assembly 708A may also include only a single bilayer 731a and 732a. Free layer assembly 708A is designed so that the effective anisotropy of the assembly is not too large, which may diminish the output signal of free layer assembly 708A to unacceptably low levels, and not too small, which may cause the magnetization of the magnetic layers to rotate too easily and cause instability. In some embodiments the effective anisotropy is such that the anisotropy field is about 1.0 kOe. In other embodiments, the anisotropy field is greater than about 1.0 kOe. Multilayer structure 730 may include any materials or combination of materials that have perpendicular to the plane anisotropy. In some embodiments, multilayer structure 730 can include Co/Pt bilayers, Co/Pd bilayers, Co/Ni bilayers, Co/Au bilayers, or Cu/Ni bilayers. In embodiments, Co/Pt or Co/PD bilayers can be utilized because they can have a larger perpendicular anisotropy than Co/Ni and Cu/Ni bilayers. The free layer assembly 708A includes, disposed on the surface of the multilayer structure 730 a top layer 734 (or layers) of a magnetic material. The top layer 734 is exchange coupled to the multilayer structure 730 that is ferromagnetic and has perpendicular anisotropy. Exemplary materials for the top layer 734 include for example CoFe, CoFeB, Co, CoB, Fe, and FeB. In embodiments, the top layer 734 can be made of CoFeB. The top layer 734, which is exchange coupled to the multilayer structure 730 having a perpendicular anisotropy, therefore also has perpendicular anisotropy.

FIG. 8B is a layer diagram of another exemplary free layer assembly 708B that is suitable for use in a magnetic sensor. The free layer assembly 708B includes a magnetic material in a top layer 734. The top layer 734 can include materials such as CoFe, CoFeB, Co, CoB, Fe, and FeB for example. In embodiments, the top layer 734 can be made of CoFeB. The free layer assembly 708B also includes an exchange coupled layer 736 that has perpendicular anisotropy. The exchange coupled layer 736 can include FePt, SmCo, or a CoPt alloy layer. In the embodiment depicted in FIG. 8B, the exchange coupled layer 736 can be crystallographically affected by layers beneath it. In the exemplary embodiment, layer 736 is adjacent a seed layer 742. The see layer 742 can be textured, or crystallographically specific so that the crystal structure of the exchange coupled layer 736 is matched to it. Underneath the seed layer 742, shields, or a shield layer 744, can be located. The shield layer 744 can also be crystallographically specific in an effort to control the crystallographic nature of the layer 736.

In embodiments, the seed layer 742 and the shield layer 744 can be part of or be buried in the shields, for example in bottom shield 625 depicted in FIGS. 7A and 7B. In an embodiment, the free layer assembly can include a layer of FePt that has a (001) crystal structure. The FePt layer in such an embodiment can be matched to seed layers that are buried in a bottom shield. The seed layer can then act as a crystallographic template for deposition of the FePt layer deposited thereon.

FIG. 8C shows a free layer assembly 708C. The free layer assembly 708C includes a magnetic layer 752, which can be made of CoFeB, Co, CoB, Fe, FeB, or CoFe for example; and a bottom layer 754, which can be made of Ta for example. The spacer layer 706, which is also shown in this depiction can be made of MgO. A three layer structure of Ta/CoFeB/MgO has been shown to have perpendicular anisotropy, and can therefore function as the free layer assembly/spacer layer in a magnetic sensor.

In any of the embodiments of the free layer assembly depicted herein, various effective anisotropies of the free layer assemblies can be obtained by altering the thickness of the top layer 734 (in the embodiments depicted in FIGS. 8A and 8B), or the magnetic layer 752 (in the embodiment depicted in FIG. 8C).

Magnetic sensors as described herein can be manufactured using any of a number of processes, including for example, atomic layer deposition (ALD), reactive sputtering, etching, photolithography techniques, plasma vapor deposition (PVD), and ion beam deposition (IBD). Magnetic sensors as described herein can be incorporated into various devices, including for example disc drives.

Thus, embodiments of MAGNETIC SENSORS WITH PERPENDICULAR ANISOTROPY FREE LAYERS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation.

What is claimed is:

1. A magnetic sensor comprising:
    a sensor stack having a front and an opposing back, wherein the front of the sensor stack defines an air bearing surface of the magnetic sensor, and the sensor stack comprises:
        a free layer assembly having a second magnetization direction, that is substantially perpendicular to a plane of each layer of the sensor stack; and
        a reference layer assembly having a first magnetization direction that is substantially perpendicular to the second magnetization direction; and
    a stabilizing structure positioned away from the air bearing surface at the back of the sensor stack, wherein the stabilizing structure provides magnetic stability to only the reference layer assembly.

2. The magnetic sensor according to claim 1, wherein the stabilizing structure comprises a permanent magnet.

3. The magnetic sensor according to claim 2, wherein the permanent magnet is positioned at the back of the reference layer assembly.

4. The magnetic sensor according to claim 2, wherein the permanent magnet has a magnetization direction that is substantially parallel to the first magnetization direction.

5. The magnetic sensor according to claim 1, wherein the stabilizing structure comprises an antiferromagnetic portion.

6. The magnetic sensor according to claim 5, wherein the reference layer assembly consists of a single ferromagnetic layer.

7. The magnetic sensor according to claim 6, wherein the antiferromagnetic portion is in contact with the single ferromagnetic layer opposite the spacer layer at the back of the sensor stack.

8. The magnetic sensor according to claim 7, wherein the antiferromagnetic portion is exchange coupled to the single ferromagnetic layer.

9. The magnetic sensor according to claim 5, wherein the reference layer assembly comprises a ferromagnetic pinned layer, an antiferromagnetic pinning layer, and a nonmagnetic metal layer positioned therebetween.

10. The magnetic sensor according to claim 9, wherein the antiferromagnetic portion is in contact with the antiferromagnetic pinning layer.

11. The magnetic sensor according to claim 1, wherein the free layer assembly comprises at least one layer of CoFeB.

12. The magnetic sensor according to claim 11, wherein the free layer assembly further comprises a multilayer stack of layers of Co and Pt; or at least one layer of (001) oriented FePt.

13. The magnetic sensor according to claim 11, wherein the free layer assembly further comprises a layer of MgO and a layer of Ta, wherein the layer of CoFeB is positioned between the layer of MgO and the layer of Ta.

14. The magnetic sensor according to claim 1 further comprising soft ferromagnetic side shields on both sides of the sensor stack at the air bearing surface of the magnetic sensor.

15. A magnetic sensor comprising:
    a sensor stack having a front and an opposing back, wherein the front of the sensor stack defines an air bearing surface of the magnetic sensor, and the sensor stack comprises:
        a reference layer assembly having a first magnetization direction, the reference layer assembly comprising at least one ferromagnetic layer;
        a free layer assembly having an effective magnetization direction substantially perpendicular to the first magnetization direction and substantially perpendicular to a plane of each layer of the sensor stack, the free layer assembly comprising at least one layer of CoFeB; and
    a stabilizing structure positioned away from the air bearing surface at the back of the sensor stack, wherein the stabilizing structure provides magnetic stability to only the reference layer assembly.

16. The magnetic sensor according to claim 15, wherein the stabilizing structure comprises a permanent magnet that has a magnetization direction that is substantially parallel to the first magnetization direction.

17. The magnetic sensor according to claim 16, wherein the permanent magnet is positioned at the back of the reference layer assembly.

18. The magnetic sensor according to claim 16, wherein the permanent magnet has a thickness from about 3 nm to about 20 nm.

19. The magnetic reader according to claim 16, wherein the free layer assembly further comprises a layer of Ta, wherein the layer of CoFeB is positioned between the layer of Ta and the spacer layer of the magnetic sensor.

20. A magnetic sensor comprising:
    a sensor stack having a front and an opposing back, wherein the front of the sensor stack defines an air bearing surface of the magnetic sensor, and the sensor stack comprises:
        a free layer assembly having a second magnetization direction that is substantially perpendicular to a plane of each layer of the sensor stack, the free layer assembly comprising a layer of CoFeB a layer of Ta;
        a spacer layer positioned adjacent the free layer assembly; and
        a reference layer assembly having a first magnetization direction that is substantially perpendicular to the second magnetization direction,
        wherein the CoFeB layer of the free layer assembly is adjacent the spacer layer; and
    a permanent magnet positioned away from the air bearing surface at the back of the sensor stack, the permanent magnet having a magnetization direction that is substantially perpendicular to the second magnetization direction, the permanent magnet providing magnetization stability to only the reference layer assembly.

21. A magnetic sensor comprising:
- a sensor stack having a front and an opposing back, wherein the front of the sensor stack defines an air bearing surface of the magnetic sensor, and the sensor stack comprises:
- a free layer assembly having a second magnetization direction, that is substantially perpendicular to a plane of each layer of the sensor stack; and
- a reference layer assembly having a first magnetization direction that is substantially perpendicular to the second magnetization direction; and
- a stabilizing structure positioned away from the air bearing surface at the back of the sensor stack, the stabilizing structure comprising an antiferromagnetic portion.

22. The magnetic sensor according to claim 21, wherein the reference layer assembly consists of a single ferromagnetic layer.

23. The magnetic sensor according to claim 22, wherein the antiferromagnetic portion is in contact with the single ferromagnetic layer opposite the spacer layer at the back of the sensor stack.

24. The magnetic sensor according to claim 23, wherein the antiferromagnetic portion is exchange coupled to the single ferromagnetic layer.

25. The magnetic sensor according to claim 21, wherein the reference layer assembly comprises a ferromagnetic pinned layer, an antiferromagnetic pinning layer, and a nonmagnetic metal layer positioned therebetween.

26. The magnetic sensor according to claim 25, wherein the antiferromagnetic portion is in contact with the antiferromagnetic pinning layer.

* * * * *